(12) United States Patent
Kim et al.

(10) Patent No.: US 9,087,932 B2
(45) Date of Patent: Jul. 21, 2015

(54) SEMICONDUCTOR LIGHT EMITTING DEVICE AND MANUFACTURING METHOD THEREOF

(71) Applicant: SAMSUNG ELECTRONICS CO., LTD., Suwon-si, Gyeonggi-do (KR)

(72) Inventors: Tae Hun Kim, Gyeonggi-do (KR); Sung Joon Kim, Gyeonggi-do (KR); Yong Il Kim, Gyeonggi-do (KR); Yung Ho Ryu, Gyeonggi-do (KR); Myeong Rak Son, Gyeonggi-do (KR); Su Yeol Lee, Gyeonggi-do (KR); Seung Hwan Lee, Gyeonggi-do (KR); Tae Sung Jang, Gyeonggi-do (KR); Su Min Hwangbo, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/948,797

(22) Filed: Jul. 23, 2013

(65) Prior Publication Data
US 2014/0117392 A1 May 1, 2014

(30) Foreign Application Priority Data
Oct. 26, 2012 (KR) .................. 10-2012-0119562

(51) Int. Cl.
*H01L 33/00* (2010.01)
*H01L 21/00* (2006.01)

(52) U.S. Cl.
CPC .......... *H01L 33/007* (2013.01); *H01L 33/0079* (2013.01)

(58) Field of Classification Search
CPC ... H01L 27/30; H01L 27/3239; H01L 31/143; H01L 31/162; H01L 33/08; H01L 33/18; H01L 33/24; H01L 51/5032
See application file for complete search history.

(56) References Cited

U.S. PATENT DOCUMENTS

| | | | |
|---|---|---|---|
| 2006/0084245 A1 | 4/2006 | Kohda | |
| 2007/0077673 A1* | 4/2007 | Hwang et al. | 438/46 |
| 2008/0048206 A1 | 2/2008 | Lee et al. | 257/103 |
| 2011/0204402 A1* | 8/2011 | Jeong et al. | 257/98 |
| 2011/0212559 A1 | 9/2011 | Ohmae et al. | |
| 2012/0001222 A1* | 1/2012 | Moon et al. | 257/99 |

FOREIGN PATENT DOCUMENTS

| | | |
|---|---|---|
| JP | 10-242577 | 9/1998 |
| JP | 2006-114829 A | 4/2006 |
| JP | 2009-242130 A | 10/2009 |
| JP | 2009-246393 A | 10/2009 |
| KR | 10-2004-0022114 A | 3/2004 |

* cited by examiner

*Primary Examiner* — Chuong A Luu
*Assistant Examiner* — Moin Rahman
(74) *Attorney, Agent, or Firm* — McDermott, Will & Emery LLP

(57) ABSTRACT

A method for manufacturing a semiconductor light emitting device includes forming an isolation pattern on a semiconductor single crystal growth substrate. A first conductivity-type semiconductor layer, an active layer, and a second conductivity-type semiconductor layer are sequentially grown in one chip unit region of the semiconductor single crystal growth substrate defined by the isolation pattern, and a reflective metal layer is formed to cover the light emitting structure and the isolation pattern. A support substrate is formed on the reflective metal layer, and the semiconductor single crystal growth substrate is removed from the light emitting structure. The support substrate is then cut into individual light emitting devices.

8 Claims, 9 Drawing Sheets

SEMICONDUCTOR LIGHT EMITTING DEVICE AND MANUFACTURING METHOD THEREOF

CROSS-REFERENCE TO RELATED APPLICATIONS

This application claims the priority of Korean Patent Application No. 10-2012-0119562 filed on Oct. 26, 2012, in the Korean Intellectual Property Office, the disclosure of which is incorporated herein by reference.

TECHNICAL FIELD

The present disclosure relates to a semiconductor light emitting device and a manufacturing method thereof.

BACKGROUND

A semiconductor light emitting device (LED) is a device that generates light energy according to electron-hole recombination when an electrical current is applied thereto by using the characteristics of a p-n junction structure. Namely, when a forward voltage is applied to a semiconductor formed of a particular element, electrons and holes move through a junction of a positive electrode and a negative electrode and are thereby recombined The recombined electrons and holes have an energy level that is lower than their energy level when they are alone (separated). Light is emitted due to the difference in energy levels.

A light emitting diode (LED) can be manufactured by attaching a support substrate to a light emitting structure placed on a growth substrate, and removing the growth substrate. A laser lift-off process is commonly used to remove the growth substrate. However, the laser lift-off process may generate micro-cracks in a semiconductor layer in a region adjacent to the growth substrate due to laser irradiation, thereby degrading a luminous efficiency of the LED. Such damage may be avoided through the use of an additional process. However, the additional process substantially complicates the manufacturing of the LED.

SUMMARY

An aspect of the present disclosure provides a semiconductor light emitting device having enhanced reliability as a result of being stably separated from a growth substrate, and a manufacturing method thereof.

Another aspect of the present disclosure provides a semiconductor light emitting device having a high degree of price competitiveness and high luminous efficiency as a result of being formed using a simplified manufacturing process, and a manufacturing method thereof.

According to an aspect of the present disclosure, a method for manufacturing a semiconductor light emitting device is provided. The method includes forming an isolation pattern on a semiconductor single crystal growth substrate, wherein the isolation pattern defines a plurality of chip unit regions disposed between portions of the isolation pattern on the semiconductor single crystal growth substrate. A first conductivity-type semiconductor layer, an active layer, and a second conductivity-type semiconductor layer are sequentially grown in one chip unit region of the semiconductor single crystal growth substrate defined by the isolation pattern, so as to form a light emitting structure having a height lower than a height of the isolation pattern. A reflective metal layer is formed to cover the light emitting structure and the isolation pattern. A support substrate is formed on the reflective metal layer. The semiconductor single crystal growth substrate is removed from the light emitting structure, and the support substrate is cut into individual light emitting devices.

The method may further include removing the isolation pattern from the light emitting structure after the removing of the semiconductor single crystal growth substrate from the light emitting structure.

The method may further include, after the removing of the isolation pattern, forming a passivation layer on lateral surfaces of the light emitting structure, on a portion of one surface of the light emitting structure from which the semiconductor single crystal growth substrate is removed, on lateral surfaces of the reflective metal layer, and on a region of an upper surface of the reflective metal layer on which the light emitting structure is not formed.

The isolation pattern may be formed to be non-orthogonally sloped with respect to a surface of the semiconductor single crystal growth substrate.

The reflective metal layer may include at least one of silver (Ag), nickel (Ni), aluminum (Al), rhodium (Rh), palladium (Pd), iridium (Ir), ruthenium (Ru), magnesium (Mg), zinc (Zn), platinum (Pt), and gold (Au).

The method may further include etching a surface of the light emitting structure, from which light is emitted, to form a light extraction pattern, after the removing of the semiconductor single crystal growth substrate from the light emitting structure.

The method may further include, after the removing of the semiconductor single crystal growth substrate, forming an electrode on an upper surface of the light emitting structure from which the semiconductor single crystal growth substrate is removed, wherein the electrode is operative to apply power to the light emitting structure.

The method may further include forming a metal layer on a lower surface of the support substrate, simultaneously with the forming of the electrode for applying power to the light emitting structure or after the forming of the electrode for applying power to the light emitting structure.

According to another aspect of the present disclosure, a semiconductor light emitting device is provided. The device includes a conductive substrate, a reflective metal layer disposed on the conductive substrate, and a light emitting structure including a second conductivity-type semiconductor layer, an active layer, and a first conductivity-type semiconductor layer sequentially disposed on the reflective metal layer. An insulating layer covers lateral surfaces of the light emitting structure, lateral surfaces of the reflective metal layer, and a region of an upper surface of the reflective metal layer in which the light emitting structure is not disposed. An outer surface of the insulating layer is vertically coplanar with an outer surface of the conductive substrate.

A surface, among lateral surfaces of the insulating layer, facing the light emitting structure may be non-orthogonally sloped with respect to a surface of the conductive substrate.

The insulating layer may be formed of any one of an oxide layer and a nitride layer.

The reflective metal layer may include at least one of silver (Ag), nickel (Ni), aluminum (Al), rhodium (Rh), palladium (Pd), iridium (Ir), ruthenium (Ru), magnesium (Mg), zinc (Zn), platinum (Pt), and gold (Au).

A surface of the light emitting structure from which light is emitted may include a light extraction pattern thereon.

The semiconductor light emitting device may include an electrode disposed on an upper surface of the light emitting structure and configured to apply power to the light emitting structure.

The semiconductor light emitting device may include a metal layer disposed on a lower surface of the conductive substrate.

According to another aspect of the present disclosure, a method for manufacturing a semiconductor light emitting device is provided. The method includes forming an isolation pattern on a semiconductor single crystal growth substrate, wherein the isolation pattern is formed on regions of the semiconductor single crystal growth substrate disposed on scribe lines along which chip units are to be cut to form individual light emitting devices. A first conductivity-type semiconductor layer, an active layer, and a second conductivity-type semiconductor layer are sequentially grown in a chip unit region of the semiconductor single crystal growth substrate disposed between the isolation pattern and the scribe lines, so as to form a light emitting structure having a height lower than a height of the isolation pattern. A reflective metal layer is formed to cover the light emitting structure and the isolation pattern. A support substrate is formed on the reflective metal layer. The semiconductor single crystal growth substrate is removed from the light emitting structure, and the support substrate is cut along the scribe lines into chip units each having an individual light emitting device thereon.

The isolation pattern may be formed as a stripe pattern in which each stripe is formed along a scribe line and is spaced apart from a neighboring stripe by the chip unit region in which the light emitting structure is formed.

The isolation pattern may be formed as grid pattern including stripes formed in two orthogonal directions, in which each stripe of the grid pattern is spaced apart from neighboring parallel stripes such that a plurality quadrangular regions formed between intersecting stripes serve as the chip unit area.

The isolation pattern may be formed of a plurality of dots disposed on the scribe lines and spaced apart from each other at predetermined intervals.

The isolation pattern may be formed on a plurality of regions on the semiconductor single crystal growth substrate, wherein each region has a triangular shape.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
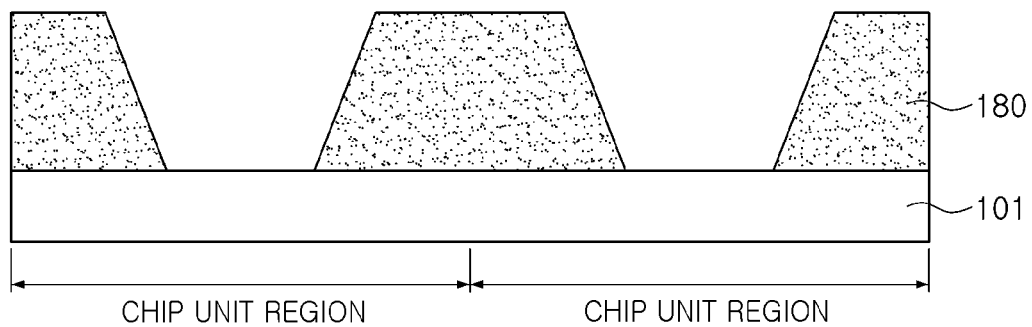
FIGS. 1A and 2 through 7 are cross-sectional views illustrating steps of a method for manufacturing a semiconductor light emitting device according to an embodiment of the present disclosure.

Embodiments illustrative of the present disclosure will now be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like components.

Hereinafter, a method for manufacturing a semiconductor light emitting device according to an embodiment of the present disclosure will be described with reference to the accompanying drawings.

FIGS. 1A and 2 through 7 are cross-sectional views illustrating steps of a method for manufacturing a semiconductor light emitting device according to an embodiment of the present disclosure. FIG. 1A is a cross-sectional view and FIGS. 1B through 1F are plan views illustrating an isolation pattern 180 formed on a growth substrate 101 and defining chip unit regions.

First, as illustrated in FIG. 1A, the isolation pattern 180 is formed on the growth substrate 101 to define chip unit regions.

The growth substrate 101 is provided as a semiconductor growth substrate and may be made of an insulating, conductive, or semiconductor material such as sapphire, Si, SiC, $MgAl_2O_4$, MgO, $LiAlO_2$, $LiGaO_2$, GaN, or the like. For example, the substrate 101 is made of sapphire having electrical insulating properties. Sapphire is a crystal having Hexa-Rhombo R3c symmetry, having lattice constants in c-axis and a-axis directions of approximately 13.001 Å and 4.758 Å, respectively, and having a C-plane (0001), an A-plane (1120), an R-plane (1102), and the like. A nitride thin film may be relatively easily formed on the C-plane of the sapphire crystal, and because sapphire crystal is stable at high temperatures, it may be used as a nitride growth substrate. Another material appropriate for use as the growth substrate 101 may be a silicon (Si) substrate. Since silicon (Si) substrates can be formed to have large diameters and have relatively low prices, they can advantageously be used in mass-production applications.

The isolation pattern 180 formed on the growth substrate 101 defines and circumscribes each chip unit region. The isolation pattern 180 can be formed on the growth substrate 101 by using a patterned mask. A light emitting structure region 160 can be formed afterwards within boundaries defined by the isolation pattern 180.

The isolation pattern 180 may be formed by using various deposition methods such as e-beam deposition, sputtering, or plasma-enhanced chemical vapor deposition (PECVD). The isolation pattern 180 may be formed of an insulating layer selected from among an oxide layer such as $SiO_2$, $Al_2O_3$, or the like, and a nitride layer such as $Si_3N_4$, SiON, or the like. Also, the isolation pattern 180 may be made of a conductive material. In particular, in embodiments in which the light emitting structure is a GaN-based semiconductor, the isolation pattern 180 may be made of a material restraining or preventing a GaN layer from being grown on an upper surface thereof. Also, the isolation pattern 180 may be a distributed Bragg reflector (DBR) structure in which dielectric layers having different refractive indices are alternately laminated.

Also, as illustrated in FIG. 1A, the isolation pattern 180 may be formed to have edges that are slanted and have a slope with respect to an upper surface of the growth substrate 101 (e.g., a non-orthogonal slant or slope having an angle with respect to the upper surface other than a 90° angle). Alternatively, the isolation pattern 180 may be formed to have edges that are perpendicular to the upper surface of the growth substrate 101.

Figure 1B:
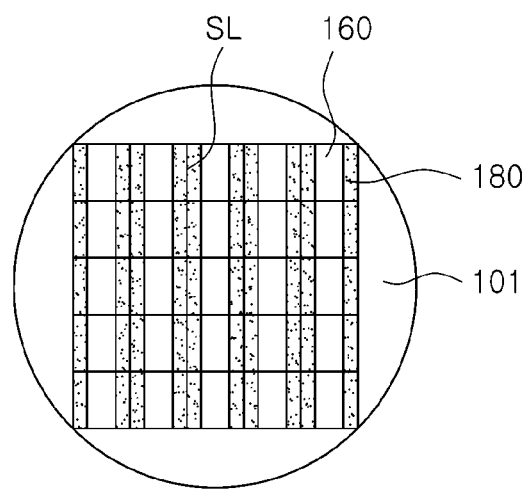
FIGS. 1B through 1F are plan views illustrating isolation patterns formed on growth substrates and defining chip unit regions for use in manufacturing semiconductor light emitting devices according to the present disclosure.

As illustrated in FIG. 1B, the isolation pattern 180 may be formed as a stripe pattern. The stripes of the pattern can be formed along scribe lines SL corresponding to lines along which the growth substrate 101 is to be cut into chip units. The stripe pattern includes a plurality of stripes spaced apart from one another. Each light emitting structure is formed within a space between neighboring stripes.

Figure 1C:
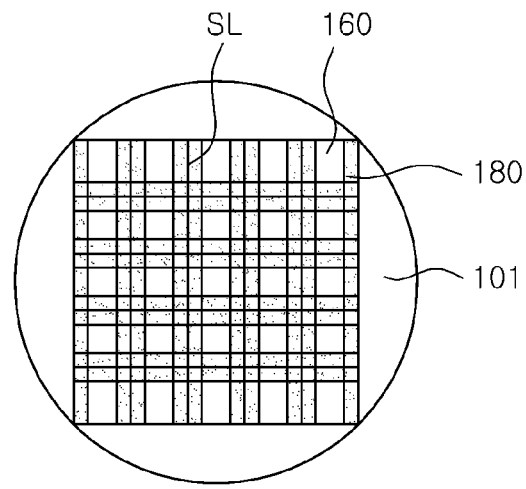

Also, as illustrated in FIG. 1C, the isolation pattern 180 may be formed as a grid pattern. For example, the grid pattern can include stripes formed in two orthogonal directions. Stripes of the pattern can be formed along the scribe lines SL along which the growth substrate 101 is to be cut into chip units.

Figure 1D:
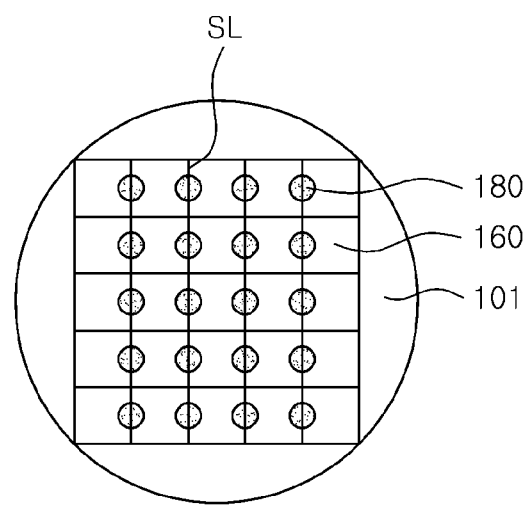

Also, as illustrated in FIG. 1D, the isolation pattern 180 may be formed as a dot pattern. Dots of the dot pattern can be located along vertical scribe lines SL. The dot pattern includes dots spaced apart from one another. Preferably, the dots have the same size and are arranged at predetermined intervals from one another to define a light emitting structure region. Also, the dots are illustrated to have a cylindrical or circular shape, but the present disclosure is not limited thereto and may have various other shapes.

Figure 1E:
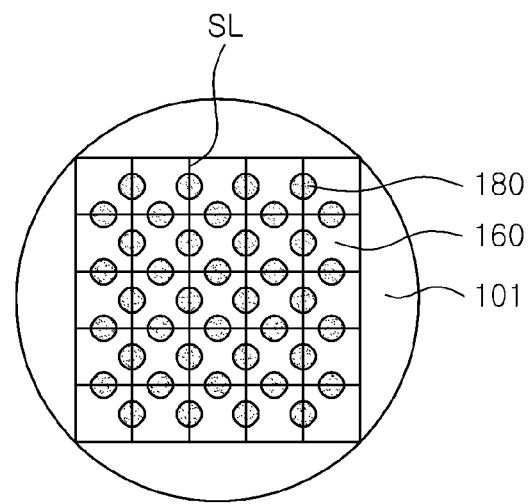

As illustrated in FIG. 1E, the isolation pattern 180 may be formed as a dot pattern in which dots are located along both horizontal and vertical sets of scribe lines SL. In FIG. 1E, the dot pattern is illustrated as being formed of dots located in a central portion of each side of quadrangles formed by the intersecting sets of horizontal and vertical scribe lines SL. However, the dot pattern may also be formed of dots randomly located along the scribe lines SL.

Figure 1F:
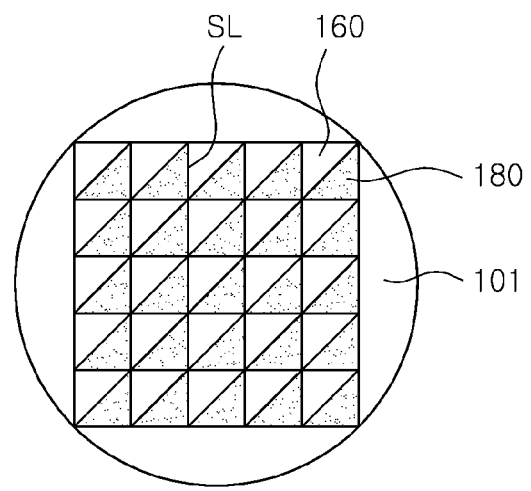

Alternatively, as illustrated in FIG. 1F, in embodiments in which a light emitting structure is formed to have a triangular shape when viewed from above, the isolation pattern 180 may be formed to have a triangular shape. More generally, the isolation pattern 180 may be formed to have various other shapes.

Figure 2:
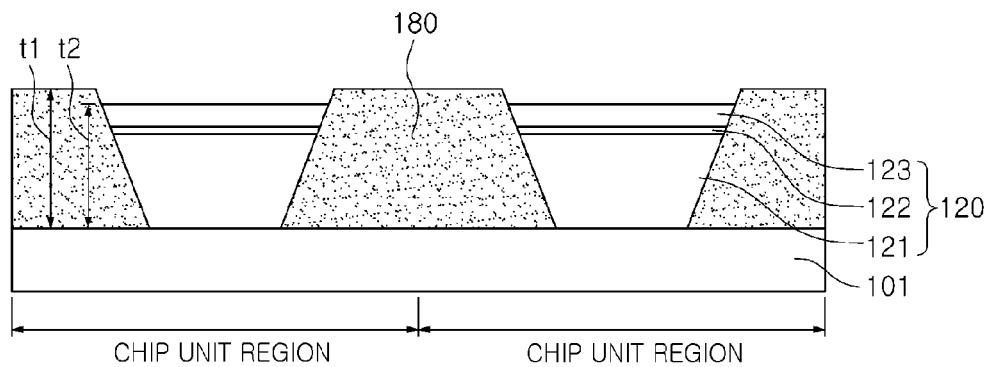

As illustrated in FIG. 2, a light emitting structure 120 is formed to have a height t2 (measured from a surface of the growth substrate 101) lower than a height t1 of the isolation pattern 180 (measured from the surface of the growth substrate 101). The light emitting structure 120 is formed in a light emitting structure region defined by the space between adjacent portions of the isolation pattern 180 on the growth substrate 101.

In this manner, in an embodiment in which the light emitting structure 120 is formed in the region defined by the space between adjacent portions of the isolation pattern 180, the light emitting structure 120 is formed such that it has the height t2 lower than the height t1 of the isolation pattern 180. Hence, when the light emitting structure 120 is separated into respective chip units by cutting along scribe lines SL, the growth substrate 101 may be cut in an area on which the isolation pattern 180 region is formed. As a result, the separation of the substrate into individual light emitting devices is facilitated, and the propagation of cracks is prevented along the semiconductor layer in the light emitting structure during a follow-up process of removing the growth substrate. Additionally, a reflective metal layer formed on the semiconductor layer formed in a follow-up process is prevented from being delaminated from the semiconductor layer.

Also, an isolation process of separating the light emitting structure and a process for preventing a formation of cracks in the semiconductor layer can be unified into a single process of forming the isolation pattern 180, thereby simplifying the process of manufacturing light emitting structures and devices.

Also, in forming the light emitting structure, the light emitting structure 120, formed of semiconductor layer(s), is formed in a relatively small region between neighboring isolation patterns 180. As a result, a growth stress caused by the growth of the semiconductor layer(s) and by differences between lattice constants and coefficients for thermal expansion of the semiconductor layer(s) and the substrate 101 can be reduced. Thus, the substrate can be prevented from being warped.

Referring to the light emitting structure 120, the light emitting structure 120 includes first and second conductivity-type semiconductor layers 121 and 123 and an active layer 122 disposed therebetween. The first and second conductivity-type semiconductor layers 121 and 123 may be made of a nitride semiconductor, e.g., a material having a composition of $Al_xIn_yGa_{1-x-y}N$ ($0 \leq x \leq 1$, $0 \leq y \leq 1$, $0 \leq x+y \leq 1$). Alternatively, the first and second conductivity-type semiconductor layers 121 and 123 may also be made of an AlInGaP or an AlInGaAs-based material, or the like. Also, the first and second conductivity-type semiconductor layers 121 and 123 may be doped with an n-type impurity and a p-type impurity, respectively, but the present disclosure is not necessarily limited thereto. The active layer 122 disposed between the first and second conductivity-type semiconductor layers 121 and 123 emits light having a certain level of energy according to electron-hole recombination, and may have a multi-quantum well (MQW) structure in which quantum well layers and quantum barrier layers are alternately laminated.

Meanwhile, the first and second conductivity-type semiconductor layers 121 and 123 and the active layer 122 constituting the light emitting structure 120 may be grown by using a process such as metal-organic chemical vapor deposition (MOCVD), hydride vapor phase epitaxy (HVPE), molecular beam epitaxy (MBE), or the like.

In the above description, the first conductivity-type semiconductor layer 121 includes an n-type semiconductor layer, and the second conductivity-type semiconductor layer 123 includes a p-type semiconductor layer. However, the embodiment of the present disclosure is not limited thereto. Namely, the first conductivity-type semiconductor layer 121 may include a p-type semiconductor layer and the second conductivity-type semiconductor layer 123 may include an n-type semiconductor layer. Also, a doping concentration of dopants in the first conductivity-type semiconductor layer 121 and the second conductivity-type semiconductor layer 123 may be uniform or non-uniform. Namely, the light emitting structure 120 may be variously modified, and the present disclosure is not limited to any particular structure thereof.

Meanwhile, in order to alleviate stress caused by a difference in lattice constants, a buffer layer (not shown) and/or an undoped nitride layer (not shown) may be formed between the light emitting structure 120 and the growth substrate 101.

Figure 3:
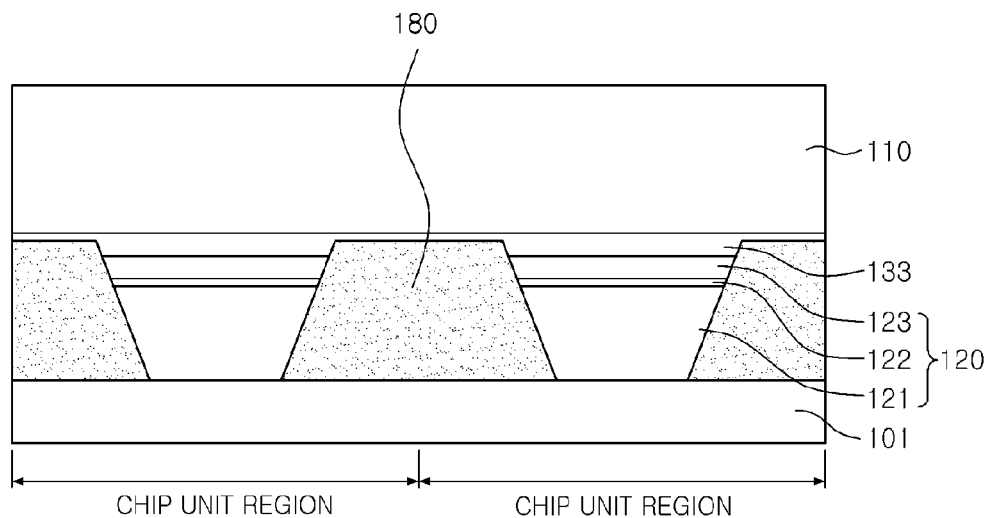

Subsequently, as illustrated in FIG. 3, a reflective metal layer 133 and a support substrate 110 are formed on the light emitting structure 120.

The reflective metal layer 133 is made of a metal having a high level of reflectivity. The reflective metal layer 133 can further be made of a material exhibiting electrically ohmic-characteristics with respect to the second conductivity-type semiconductor layer 123. In consideration of its function, the reflective metal layer 133 may be made of a material including silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like. Also, although not shown, the reflective metal layer 133 may have a structure including two or more layers to enhance reflective efficiency. For example, the structure may include two or more layers respectively formed of Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like. The reflective metal layer 133 may be formed by performing depositing, sputtering, or the like, on such a high reflective metal.

Also, in addition to the ohmic-contact function with the second conductivity-type semiconductor layer 123, the reflective metal layer 133 may also serve to reflect light which proceeds toward the reflective metal layer 133 after being generated in the active layer 122 of the light emitting structure 120. The light may be reflected toward the first conductivity-type nitride semiconductor layer 121. Thus, luminance efficiency of the light emitting device 100 can be improved.

Here, the reflective metal layer 133 may be formed to cover the light emitting structure 120 and the isolation pattern 180. In this case, since the reflective metal layer 133 is formed to cover the light emitting structure 120 and the isolation pattern 180, the reflective metal layer 133 of a plurality of light emitting devices can be simultaneously formed through a single process, simplifying the process.

Also, a current blocking layer (not shown) may be formed between the reflective metal layer 133 and the second conductivity-type semiconductor layer 123.

The support substrate 110 may serve as a support body supporting the light emitting structure during a follow-up laser lift-off process, or the like. Also, when the support substrate 110 is made of a conductive material, it may be connected to an external power source to apply an electrical signal to the second conductivity-type semiconductor layer 123. In consideration of this function, the support substrate 110 may be made of a material including any one of gold (Au), nickel (Ni), aluminum (Al), copper (Cu), tungsten (W), silicon (Si), selenium (Se), and gallium arsenide (GaAs), for example, or may be made of a material doped with aluminum (Al) in a silicon (Si) substrate. In this case, the support substrate 110 may be formed on the reflective metal layer 133 through a process such as plating, sputtering, deposition, or the like. Alternatively, a previously fabricated support substrate 110 may be bonded to the reflective metal layer 133 by the medium of a conductive bonding layer. As the conductive bonding layer, a eutectic metal such as AuSn, or the like, may be used, or a conductive epoxy, or the like, may be used.

Figure 4:
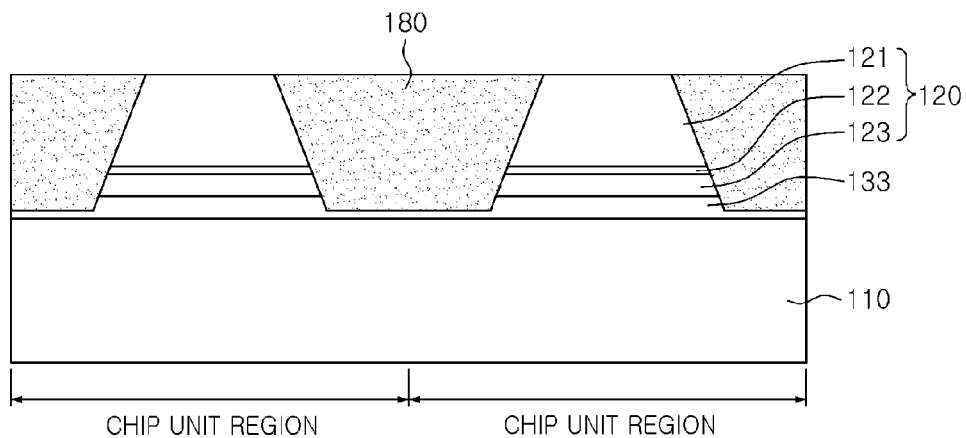

After the support substrate 110 is attached, as illustrated in FIG. 4, the growth substrate 101 is removed from the light emitting structure 120. The structure illustrated in FIG. 4 corresponds to the structure shown in FIG. 3 which has been rotated by 180°.

The growth substrate 101 may be removed through a laser lift-off method or a chemical lift-off method.

Figure 5:
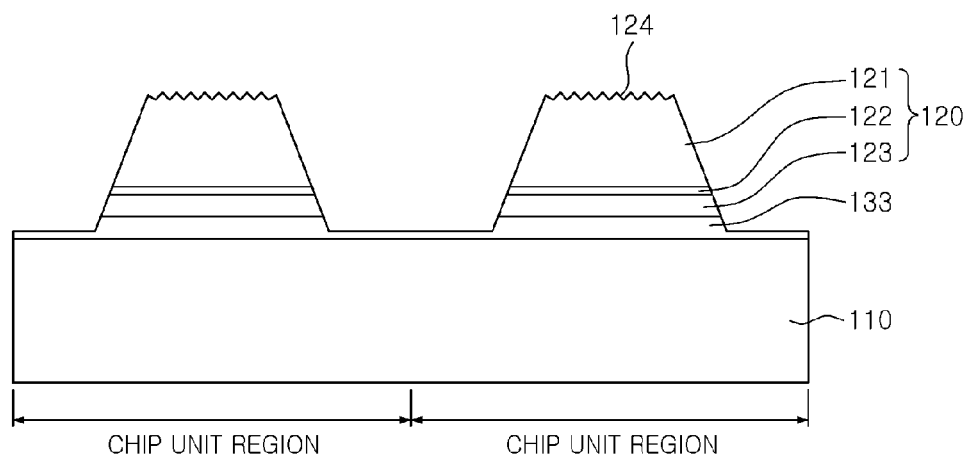

Subsequently, as illustrated in FIG. 5, in order to demarcate the light emitting structure 120 according to chip unit regions, the isolation pattern 180 is removed. In this case, the isolation pattern 180 may be removed using various methods such as wet etching, dry etching, or the like.

Also, in order to enhance light extraction efficiency, a light extraction pattern 124 is formed on an upper surface of the first conductivity-type semiconductor layer 121 (i.e., a surface of the first conductivity-type semiconductor layer 121 which was in contact with the growth substrate 101).

The light extraction pattern 124 formed on an upper surface of the first conductivity-type semiconductor layer 121 may be formed using a wet etching process or a dry etching process. In detail, the light extraction pattern 124 may be formed by etching the upper surface of the first conductivity-type semiconductor layer 121 with potassium hydroxide (KOH). The light extraction pattern 124 minimizes a quantity of light totally reflected from the surface thereof and thereby enhances light extraction efficiency.

The removing of the isolation pattern 180 and the forming of the light extraction pattern 140 may be simultaneously performed.

Figure 6:
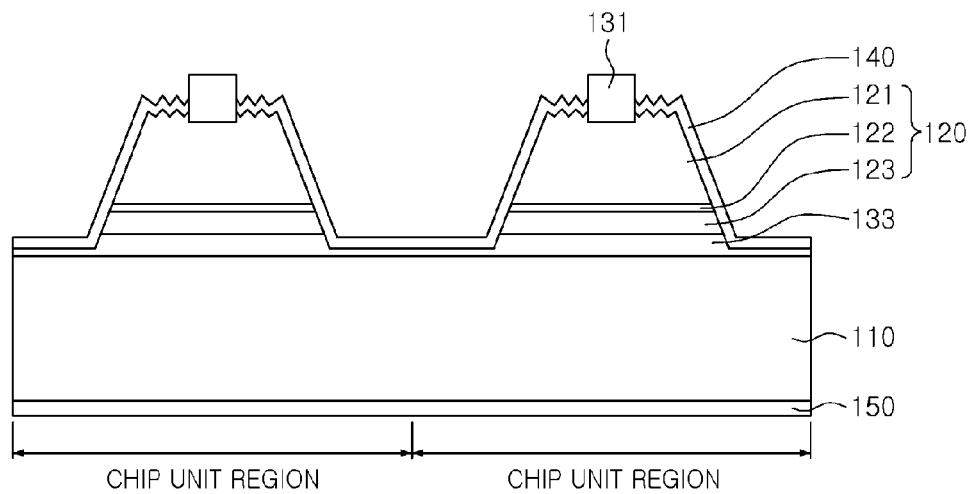

Subsequently, as illustrated in FIG. 6, a passivation layer 140 is formed on an upper surface and lateral surfaces of the first conductivity-type semiconductor layer 121, and on exposed lateral surfaces and/or upper surface of the reflective metal layer 133. The passivation layer 140 is subsequently selectively removed such that an upper surface of the first conductivity-type semiconductor layer 121 is at least partially exposed.

Subsequently, a first electrode 131 is formed on an upper surface of the first conductivity-type semiconductor layer 121 in an exposed region of the first conductivity-type semiconductor layer 121.

The first electrode 131 may be made of a metal having excellent conductivity, e.g., gold (Au), palladium (Pd), platinum (Pt), ruthenium (Ru), rhenium (Re), magnesium (Mg), zinc (Zn), hafnium (Hf), tantalum (Ta), rhodium (Rh), iridium (Ir), tungsten (W), titanium (Ti), silver (Ag), chromium (Cr), molybdenum (Mo), niobium (Nb), aluminum (Al), nickel (Ni), copper (Cu), vanadium (V), or an alloy thereof.

For example, the first electrode 131 may include an ohmic layer formed to be in contact with the light emitting structure 120 for ohmic-contact with the light emitting structure 120 and an electrode layer formed on the ohmic layer. For example, the ohmic layer may include chromium (Cr), aluminum (Al), vanadium (V), and titanium (Ti), and the like. The electrode layer may be formed by sequentially laminating a barrier layer including nickel (Ni), aluminum (Al), and the like, a metal layer including copper (Cu), and the like, a barrier layer including nickel (Ni), aluminum (Al), and the like, and a wire bonding layer including gold (Au), and the like. However, the present disclosure is not limited thereto and the electrode layer may be configured as a single layer such as a tungsten (W) layer, a tungsten-titanium (WTi) layer, a titanium (Ti) layer, an aluminum (Al) layer, a silver (Ag) layer, or the like. Also, a transparent electrode layer may be formed as the first electrode 131 on the entire surface of the first conductivity-type semiconductor layer 121, and in this case, the transparent electrode layer may be made of a material such as ITO, ZnO, RuOx, TiOx, IrOx, or the like.

Also, a metal layer 150 may be further formed on a lower surface of the support substrate 110. The metal layer 150 formed on the lower surface of the support substrate 110 may serve as a second electrode.

Here, the metal layer 150 may be made of a metal having excellent conductivity, i.e., gold (Au), palladium (Pd), platinum (Pt), ruthenium (Ru), rhenium (Re), magnesium (Mg), zinc (Zn), hafnium (Hf), tantalum (Ta), rhodium (Rh), iridium (Ir), tungsten (W), titanium (Ti), silver (Ag), chromium (Cr), molybdenum (Mo), niobium (Nb), aluminum (Al), nickel (Ni), copper (Cu), vanadium (V), or an alloy thereof.

Figure 7:
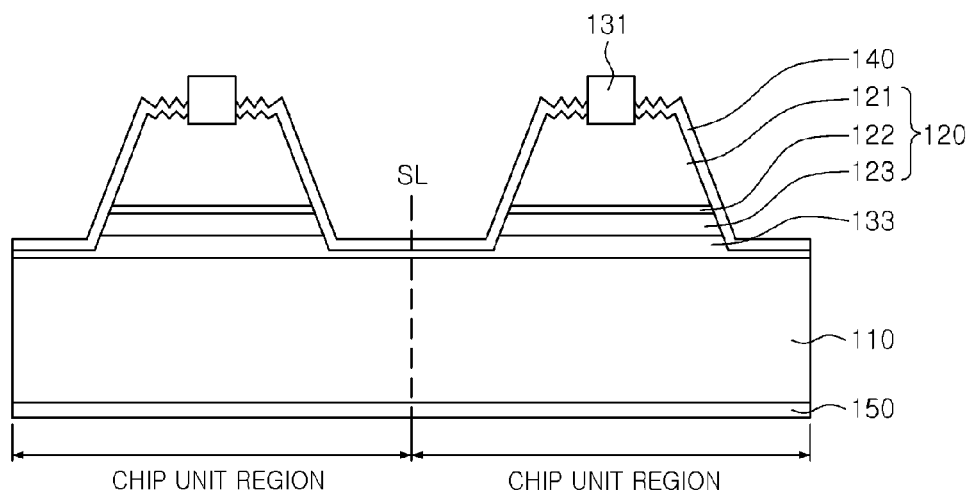

Subsequently, as illustrated in FIG. 7, the chip unit regions are separated from each other by cutting along the scribe lines SL to fabricate a plurality of light emitting devices such as the device 100 depicted in FIG. 8.

Figure 9:
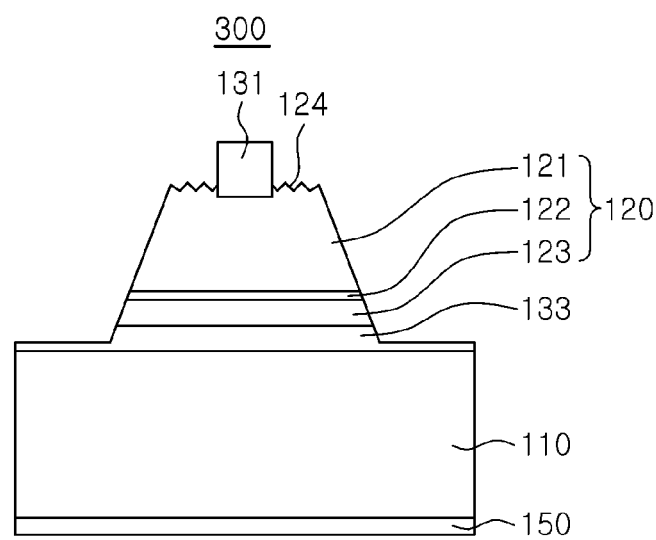
FIG. 9 is a cross-sectional view of a semiconductor light emitting device manufactured without a passivation layer according to the method for manufacturing a semiconductor light emitting device according to the embodiment of the present disclosure.

In the operation illustrated in FIG. 6, instead of forming the passivation layer 140, the first electrode 131 may be formed directly on an upper surface of the first conductivity-type semiconductor layer 121 and the chip unit regions may be separated along the scribe lines SL to fabricate a plurality of light emitting devices such as the device 300 of FIG. 9.

In the case of the semiconductor light emitting device according to an embodiment of present disclosure, the isolation pattern 180 may be first formed and the light emitting structure having a height lower than a height of the isolation pattern 180 may be formed between the isolation patterns 180. Thus, in separating the light emitting structure into respective chip units, the support substrate 110 may be cut in an area in which the isolation pattern 180 was formed, thereby facilitating separation into individual light emitting devices while effectively preventing the propagation of cracks along the semiconductor layer. Thus, the reflective metal layer 133 formed on the semiconductor layer in a follow-up process may be prevented from being delaminated from the semiconductor layer. Thus, damage generated when the growth substrate 101 is separated from the light emitting structure can be effectively reduced and stress applied to individual chips can be reduced.

Also, an isolation process of separating the light emitting structure from each other and a process for preventing a formation of cracks in the semiconductor layer may be unified into a single process, thereby simplifying a manufacturing or production process. Thus, an additional process for preventing damage to the semiconductor layer may be omitted.

Figure 8:
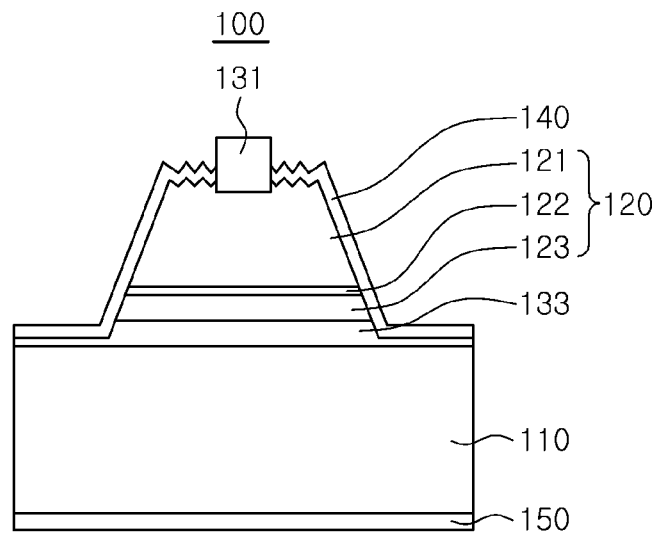
FIG. 8 is a cross-sectional view of a semiconductor light emitting device manufactured according to the method for manufacturing a semiconductor light emitting device according to the embodiment of the present disclosure.

FIG. 8 is a cross-sectional view of a semiconductor light emitting device 100 manufactured according to the method for manufacturing a semiconductor light emitting device according to the first embodiment of the present disclosure.

Referring to FIG. 8, a semiconductor light emitting device 100 manufactured according to the method for manufacturing a semiconductor light emitting device according to the first embodiment of the present disclosure includes the support substrate 110, the light emitting structure 120 positioned on the support substrate 110, and the first electrode 131 formed on an upper surface of the light emitting structure 120. The light emitting structure 120 includes the first conductivity-type semiconductor layer 121, the active layer 122, and the second conductivity-type semiconductor layer 123, and is operative to generate light.

The reflective metal layer 133 may be formed between the support substrate 110 and the light emitting structure 120. Also, the passivation layer 140 may be formed on the lateral surface of the light emitting structure 120. A current blocking layer (not shown) may be formed between the reflective metal layer 133 and the second conductivity-type semiconductor layer 123.

The light emitting structure 120 may include a plurality of compound semiconductor layers of Group III to Group V elements. Here, the second conductivity-type semiconductor layer 123 may be positioned on the reflective metal layer 133, the active layer 122 may be positioned on the second conductivity-type semiconductor layer 123, and the first conductivity-type semiconductor layer 121 may be positioned on the active layer 122. A lateral surface of the light emitting structure 120 may have various slopes according to a shape of the isolation pattern 180 used for demarcating the light emitting structure 120 into unit region regions.

The light extraction pattern 124 may be formed on an upper surface of the light emitting structure 120, specifically, on an upper surface of the first conductivity-type semiconductor layer 121. The light extraction pattern 124 may have a random shape or arrangement or may have a desired shape or arrangement.

For example, the light extraction pattern 124 may be formed by arranging a photonic crystal structure having a period ranging from 50 nm to 3000 nm. The photonic crystal structure may effectively outwardly extract light having a particular wavelength due to an interference effect, or the like.

Also, the light extraction pattern 124 may have various shapes such as a cylindrical shape, a polyprismatic shape, a conical shape, a polypyramidal shape, a truncated conical shape, a polyprismatic truncated shape, or the like, and the present disclosure is not limited thereto.

The first electrode 131 may be formed on the light emitting structure 120, and more specifically on the first conductivity-type semiconductor layer 121 of the light emitting structure 120.

The passivation layer 140 may be formed on the upper surface and the lateral surface of the light emitting structure 120 and on a portion of the exposed lateral surface and/or a portion of the exposed upper surface of the reflective metal layer 133. However, the present disclosure is not limited thereto.

In the present embodiment, the support substrate 110 including a conductive material may be used, and in this case, the support substrate 110 may serve as a second electrode.

Here, the metal layer 150 may be further formed on a lower surface of the support substrate 110. When the metal layer 150 is further formed on a lower surface of the substrate 110, power may be applied to the metal layer 150.

A light emitting device and a manufacturing method thereof according to a second embodiment of the present disclosure will be described with reference to FIGS. 10 through 12.

Parts of the second embodiment which are the same as or similar to corresponding parts of the first embodiment may be understood by the description of the first embodiment, unless otherwise specified. Steps and operations of the method for manufacturing a light emitting device according to the first embodiment of the present disclosure as described above with reference to FIGS. 1A and 2 through 4 are the same as those of the method for manufacturing a light emitting device according to the second embodiment of the present disclosure.

First, as illustrated in FIGS. 1A through 1F, the isolation pattern 180 defining chip unit regions is formed on the growth substrate 101.

Next, as illustrated in FIG. 2, the light emitting structure 120 is formed to have a height t2 lower than a height t1 of the isolation pattern 180 in a light emitting structure region defined by the isolation pattern 180 on the growth substrate 101.

Subsequently, as illustrated in FIG. 3, the reflective metal layer 133 and the support substrate 110 are formed on the light emitting structure 120.

After the support substrate 110 is attached, as illustrated in FIG. 4, the growth substrate 101 is removed from the light emitting structure 120. In FIG. 4, the structure illustrated in FIG. 3 has been rotated by 180°.

Figure 10:
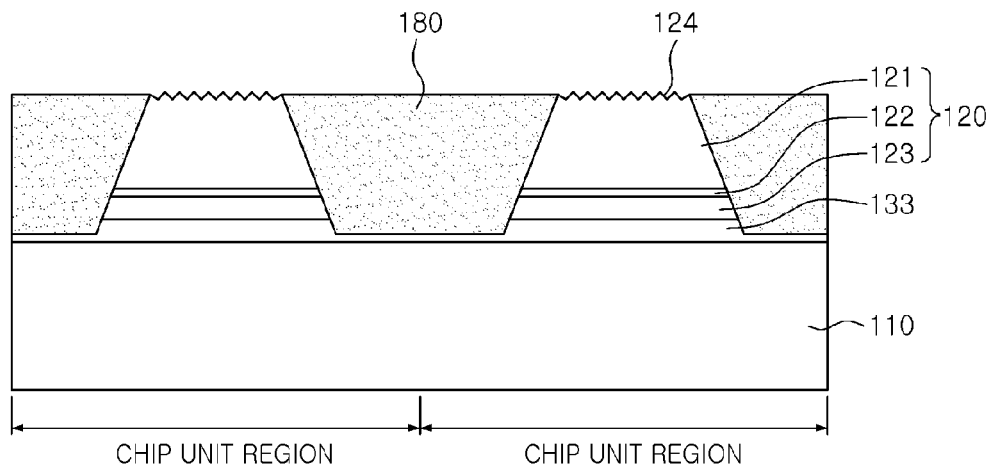
FIGS. 10 through 12 are cross-sectional views illustrating steps of a method for manufacturing a semiconductor light emitting device according to another embodiment of the present disclosure.

Thereafter, as illustrated in FIG. 10, with the isolation pattern 180 for demarcating the light emitting structure 120 along the chip unit region remaining, the light extraction pattern 124 is formed to enhance light extraction efficiency. The light extraction pattern 124 is formed on an upper surface of the first conductivity-type semiconductor layer 121, and may be formed using a wet etching process or a dry etching process. For example, the light extraction pattern 124 may be formed by etching an upper surface of the first conductivity-type semiconductor layer 121 with potassium hydroxide (KOH).

In the present embodiment, the isolation pattern 180 may be formed of an insulating layer as any one of an oxide layer such as $SiO_2$, $Al_2O_3$, or the like, or a nitride layer such as $Si_3N_4$, SiON, or the like.

In particular, in case that the light emitting structure is a gallium nitride-based semiconductor layer, the isolation pattern 180 may be made of a material preventing or restraining a GaN layer from being grown on an upper surface thereof.

Figure 11:
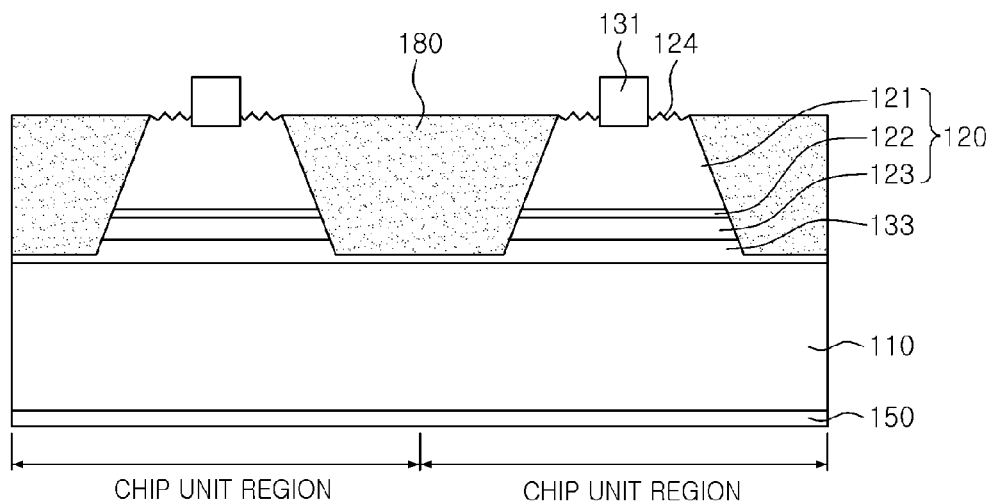

Thereafter, as illustrated in FIG. 11, the first electrode 131 is formed on an upper surface of the first conductivity-type semiconductor layer 121. Here, the metal layer 150 may be further formed on a lower surface of the support substrate 110. The metal layer 150 formed on the lower surface of the support substrate 110 may serve as a second electrode.

Figure 12:
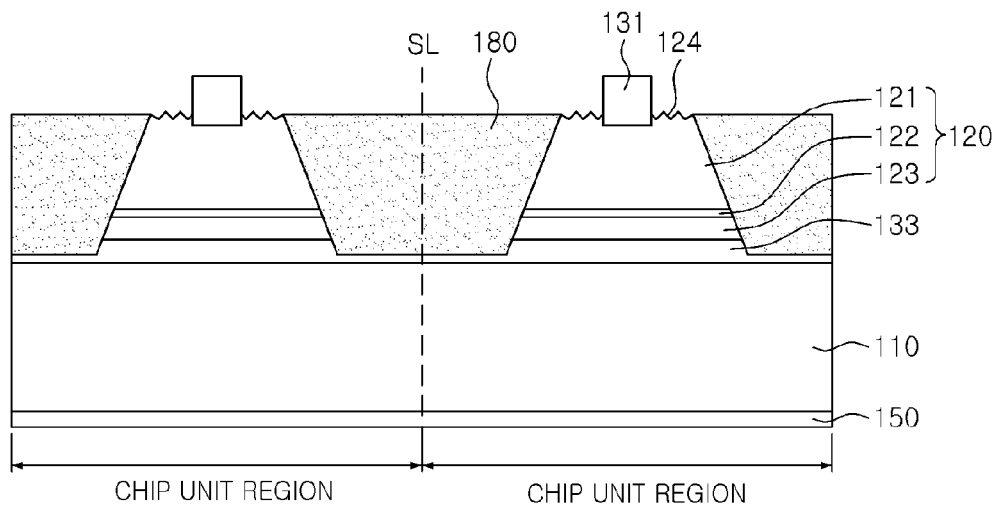

Subsequently, as illustrated in FIG. 12, the isolation pattern 180 is cut along the scribe lines SL to separate the chip unit regions to thus fabricate a plurality of light emitting devices.

Figure 13:
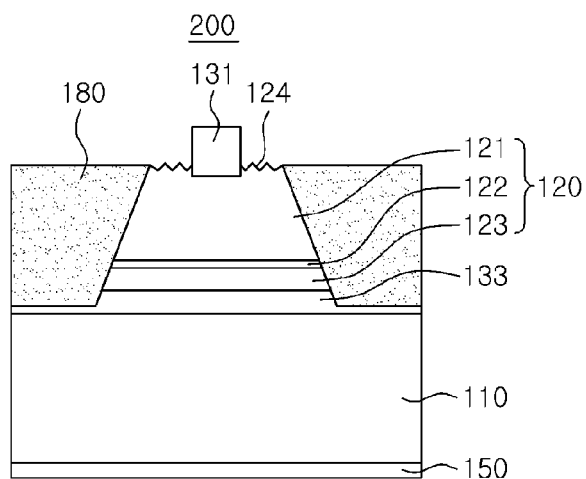
FIG. 13 is a cross-sectional view of a semiconductor light emitting device manufactured according to the method for manufacturing a semiconductor light emitting device according to the other embodiment of the present disclosure.

Thus, as illustrated in FIG. 13, a semiconductor light emitting device 200 with the isolation pattern 180 formed on lateral surfaces of the first conductivity-type semiconductor layer 121 is formed.

Namely, outer lateral surfaces of the isolation pattern 180 are vertically coplanar with the outer lateral surfaces of the support substrate 110. Here, in embodiments in which the isolation pattern 180 has a DBR structure, light emitted from the active layer 122 of the light emitting device 200 is reflected by the isolation pattern 180 having the DBR structure formed on the lateral surfaces thereof, thereby enhancing light extraction efficiency of the light emitting device 200.

In this method, since the isolation pattern 180 is not removed in comparison to the first embodiment of the present disclosure, the passivation layer 140 formation process may be omitted, and thus, the process may be further simplified.

As set forth above, according to embodiments of the disclosure, damage generated when a growth substrate 101 is separated from the light emitting structure during manufacturing of a semiconductor light emitting device can be effectively reduced, and stress applied to individual chips can be reduced.

Since the process is simplified, the semiconductor light emitting device can be manufactured with a high degree of price competitiveness.

In addition, in forming the light emitting structure, since the semiconductor layer is formed in a relatively small region between the isolation patterns, any growth stress caused by the formation of the semiconductor layer and due to differences between lattice constants and coefficients for thermal expansion of the semiconductor layer and the substrate can be reduced, and thus, the substrate can be prevented from being warped.

While the present inventive concepts have been shown and described in connection with particular embodiments, it will be apparent to those skilled in the art that modifications and variations can be made without departing from the spirit and scope of the disclosure as defined by the appended claims.

What is claimed is:

1. A method for manufacturing a semiconductor light emitting device, the method comprising:
   forming an isolation patterned layer on a semiconductor single crystal growth substrate, the isolation patterned layer defining a plurality of chip unit regions disposed between and surrounded by the isolation patterned layer on the semiconductor single crystal growth substrate;
   sequentially growing a first conductivity-type semiconductor layer, an active layer, and a second conductivity-type semiconductor layer in one of the plurality of chip unit regions of the semiconductor single crystal growth substrate defined by the isolation patterned layer, so as to form a light emitting structure having a height lower than a height of the isolation patterned layer;
   forming a reflective metal layer to cover the light emitting structure and the isolation patterned layer;
   forming a support substrate on the reflective metal layer;
   removing the semiconductor single crystal growth substrate from the light emitting structure; and
   cutting the support substrate into individual light emitting devices.

2. The method of claim 1, further comprising:
   removing the isolation patterned layer from the light emitting structure after the removing of the semiconductor single crystal growth substrate from the light emitting structure.

3. The method of claim 2, further comprising:
   after the removing of the isolation patterned layer, forming a passivation layer on lateral surfaces of the light emitting structure, on a portion of one surface of the light emitting structure from which the semiconductor single crystal growth substrate is removed, on lateral surfaces of the reflective metal layer, and on a region of an upper surface of the reflective metal layer on which the light emitting structure is not formed.

4. The method of claim 1, wherein the isolation patterned layer is formed to be non-orthogonally sloped with respect to a surface of the semiconductor single crystal growth substrate.

5. The method of claim 1, wherein the reflective metal layer includes at least one of silver (Ag), nickel (Ni), aluminum (Al), rhodium (Rh), palladium (Pd), iridium (Ir), ruthenium (Ru), magnesium (Mg), zinc (Zn), platinum (Pt), and gold (Au).

6. The method of claim 1, further comprising:
   etching a surface of the light emitting structure, from which light is emitted, to form a light extraction pattern, after the removing of the semiconductor single crystal growth substrate from the light emitting structure.

7. The method of claim 1, further comprising:
   after the removing of the semiconductor single crystal growth substrate, forming an electrode on an upper surface of the light emitting structure from which the semiconductor single crystal growth substrate is removed, wherein the electrode is operative to apply power to the light emitting structure.

8. The method of claim 7, further comprising:
   forming a metal layer on a lower surface of the support substrate, simultaneously with the forming of the electrode for applying power to the light emitting structure or after the forming of the electrode for applying power to the light emitting structure.

* * * * *